(12) United States Patent
Morimoto et al.

(10) Patent No.: US 11,345,542 B2
(45) Date of Patent: May 31, 2022

(54) ARTICLE TRANSPORT FACILITY

(71) Applicant: Daifuku Co., Ltd., Osaka (JP)

(72) Inventors: Yuichi Morimoto, Komaki (JP);
Ryosuke Noguchi, Komaki (JP)

(73) Assignee: Daifuku Co., Ltd., Osaka (JP)

(*) Notice: Subject to any disclaimer, the term of this patent is extended or adjusted under 35 U.S.C. 154(b) by 0 days.

(21) Appl. No.: 17/241,460

(22) Filed: Apr. 27, 2021

(65) Prior Publication Data
US 2021/0331866 A1 Oct. 28, 2021

(30) Foreign Application Priority Data
Apr. 28, 2020 (JP) .............................. JP2020-078879

(51) Int. Cl.
*B65G 1/04* (2006.01)

(52) U.S. Cl.
CPC ......... *B65G 1/0457* (2013.01); *B65G 1/0464* (2013.01)

(58) Field of Classification Search
CPC ...... B65G 1/0457; B65G 1/0464; B65G 1/10; B65G 2201/0297; H01L 21/67769; H01L 21/67733; H01L 21/67736
USPC ................................................. 414/281, 282
See application file for complete search history.

(56) References Cited

U.S. PATENT DOCUMENTS

| | | | |
|---|---|---|---|
| 2006/0219126 A1 | 10/2006 | Nakao | |
| 2009/0060697 A1* | 3/2009 | Wakabayashi | .... H01L 21/67733 414/807 |
| 2010/0003111 A1* | 1/2010 | Yeo | .................... H01L 21/67769 414/222.07 |
| 2010/0047045 A1* | 2/2010 | Park | .................. H01L 21/67769 414/222.07 |
| 2010/0290872 A1* | 11/2010 | Bonora | ............. H01L 21/67769 257/E21.001 |
| 2016/0247702 A1* | 8/2016 | Adachi | ............. H01L 21/67775 |
| 2019/0189490 A1* | 6/2019 | Morita | .............. H01L 21/68771 |

FOREIGN PATENT DOCUMENTS

JP    2006282382 A    10/2006

* cited by examiner

*Primary Examiner* — Glenn F Myers
(74) *Attorney, Agent, or Firm* — The Webb Law Firm

(57) ABSTRACT

A first storage section includes a first support portion that supports an article and a movable support portion that movably supports the first support portion in the path width direction. A second storage section includes a second support portion whose position in a path width direction relative to a movement path is fixed, and supports the article. A space occupied by the article in a state of being supported by the second support portion is a target space, a position at which the first support portion overlaps the target space in an up-down view along an up-down direction is an overlapping position, and a position that is adjacent to a first side relative to the overlapping position and at which the first support portion does not overlap the target space in the up-down view is a non-overlapping position.

9 Claims, 6 Drawing Sheets

ARTICLE TRANSPORT FACILITY

CROSS-REFERENCE TO RELATED APPLICATION

This application claims priority to Japanese Patent Application No. 2020-078879 filed Apr. 28, 2020, the disclosure of which is hereby incorporated by reference in its entirety.

BACKGROUND OF THE INVENTION

1. Field of the Invention

The present invention relates to an article transport facility including a transport device that moves along a movement path to transport an article, and a storage device that is disposed adjacent to the movement path, and that stores the article.

2. Description of the Related Art

An example of the article transport facility as described above is disclosed in JP 2006-282382A (Patent Document 1). In the following, the reference numerals shown in parentheses in the descriptions of the related art and the problems are those of Patent Document 1. An overhead traveling vehicle system (2), serving as an article transport facility, disclosed in Patent Document 1 includes an overhead traveling vehicle (8) that transports an article (24), and a side buffer (40) disposed laterally below a travel rail (6) on which the overhead traveling vehicle (8) travels. The overhead traveling vehicle (8) includes an elevation platform (22) that chucks the article (24), an elevation driving portion (20) that elevates and lowers the elevation platform (22), and a lateral moving portion (16) that laterally moves the elevation driving portion (20). Also, when the article (24) is transferred between the elevation platform (22) and the side buffer (40), the elevation driving portion (20) is moved in a lateral direction relative to the travel rail (6) by the lateral moving portion (16).

In the overhead traveling vehicle system (2) of Patent Document 1, as shown in FIG. 1 of the document, the side buffer (40) includes two levels of racks (41, 42). Also, in the overhead traveling vehicle system (2), the overhead traveling vehicle (8) is provided with elevation means for elevating and lowering the lateral moving portion (16), thus enabling the article (24) to be transferred not only between the elevation platform (22) and the upper rack (41), but also between the elevation platform (22) and the lower rack (42). Specifically, when the article (24) is transferred between the elevation platform (22) and the lower rack (42), the lateral moving portion (16) is lowered by the elevation means, and subsequently the elevation driving portion (20) is laterally moved by the lateral moving portion (16), thus moving the elevation platform (22) to a position above the lower rack (42). Then, the elevation platform (22) is elevated and lowered, whereby the article (24) is transferred between the elevation platform (22) and the lower rack (42).

SUMMARY OF THE INVENTION

Since the overhead traveling vehicle system (2) of Patent Document 1 is configured as described above, in order to enable the article (24) to be transferred between the overhead traveling vehicle (8) and the lower rack (42), it is essential that the overhead traveling vehicle (8) be provided with the elevation means for elevating and lowering the lateral moving portion (16). Also, the elevation means for elevating and lowering the lateral moving portion (16) needs to have a relatively large elevation stroke that is equivalent to at least the height of the article (24). For this reason, although the overhead traveling vehicle system (2) of Patent Document 1 allows the overhead traveling vehicle (8) to transport the article (24) to and from both of the two levels of racks (41, 42) included in the side buffer (40), the configuration of the overhead traveling vehicle (8) tends to be complicated.

Therefore, there is a demand for a technique that enables, when a storage device includes a plurality of levels of storage sections, a transport device to transfer an article to and from a storage section at each level, while suppressing an increase in the complexity of the configuration of the transport device.

An article transport facility according to the present disclosure includes: a transport device that moves along a movement path to transport an article; and a storage device that is disposed adjacent to the movement path, and that stores the article; wherein, assuming that a side where the storage device is disposed relative to the movement path in a path width direction that is a width direction of the movement path is a first side, the transport device includes a holding section that holds the article, an elevation mechanism for elevating and lowering the holding section, and a movement mechanism for moving the holding section along the path width direction, and is configured to cause the movement mechanism to cause the holding section to protrude to the first side when transferring the article between the holding section and the storage device, the storage device includes a first storage section, and a second storage section disposed below the first storage section, the first storage section includes a first support portion that supports the article, and a movable support portion that movably supports the first support portion in the path width direction, the second storage section includes a second support portion whose position in the path width direction relative to the movement path is fixed, and that supports the article, and, assuming that a space occupied by the article in a state of being supported by the second support portion is a target space, a position at which the first support portion overlaps the target space in an up-down view along an up-down direction is an overlapping position, and a position that is adjacent to the first side relative to the overlapping position, and at which the first support portion does not overlap the target space in the up-down view is a non-overlapping position, the transport device is provided with an operation section that acts on the storage device by coming into contact therewith so as to switch a position of the first support portion between the overlapping position and the non-overlapping position.

In this configuration, the storage device disposed on the first side relative to the movement path includes the first storage section, and the second storage section disposed below the first storage section. Also, the holding section that has been moved by the movement mechanism so as to protrude to the first side is elevated and lowered by the elevation mechanism, whereby the article can be transferred between the holding section and the first storage section or the second storage section. Here, the position, in the path width direction relative to the movement path, of the second support portion provided in the second storage section is fixed, whereas the first support portion provided in the first storage section is supported by the movable support portion so as to be movable in the path width direction. Also, the transport device is provided with the operation section that switches the position of the first support portion between the overlapping position and the non-overlapping position. Thus, when the article is transferred between the holding section and the second storage section, the first support portion or the article supported by the first support portion can be retracted from the elevation path of the holding section or the article held by the holding section by moving the first support portion to the non-overlapping position. Accordingly, with this configuration, it is possible to achieve a configuration that enables the transport device to transfer the article between the transport device and both of the first storage section and the second storage section, without providing the transport device with a mechanism for elevating and lowering the movement mechanism beyond the length of the article in the up-down direction.

Although the transport device needs to be provided with the operation section that switches the position of the first support portion between the overlapping position and the non-overlapping position in this configuration, a higher degree of freedom in the configuration and the arrangement can be easily ensured for such an operation section, than for a mechanism for elevating and lowering the movement mechanism by a height equivalent to at least the height of the article. Accordingly, with this configuration, it is possible to achieve a configuration that enables the transport device to transfer the article to and from a storage section at each level, while suppressing an increase in the complexity of the configuration of the transport device.

This configuration further has the following advantages. While it may be possible to adopt a configuration in which, unlike this configuration, the first support portion is fixed at the non-overlapping position, in that case, the amount of protrusion of the holding section to the first side that is required to transfer the article between the holding section and the first storage section is likely to increase. In contrast, with this configuration, the first support portion can be moved to the overlapping position when the article is transferred between the holding section and the first storage section. Accordingly, the amount of protrusion of the holding section to the first side that is required to transfer the article between the holding section and the first storage section can be the same as or comparable to the amount of protrusion of the holding section to the first side that is required to transfer the article between the holding section and the second storage section. In this respect as well, this configuration can suppress an increase in the complexity of the configuration of the transport device. Furthermore, when the article is transferred between the holding section and the second storage section, this configuration allows the first support portion to be retracted to a position at which the first support portion is less likely to interfere with such transfer. Accordingly, the gap between the article supported by the second support portion and the first support portion in the up-down direction can be kept small, thus also making it possible to suppress an increase in the size of the storage device in the up-down direction.

Further features and advantages of the article transport facility will become apparent from the following description of embodiments with reference to the drawings.

DETAILED DESCRIPTION OF PREFERRED EMBODIMENTS

First Embodiment

A first embodiment of an article transport facility will be described with reference to the drawings.

Figure 1:
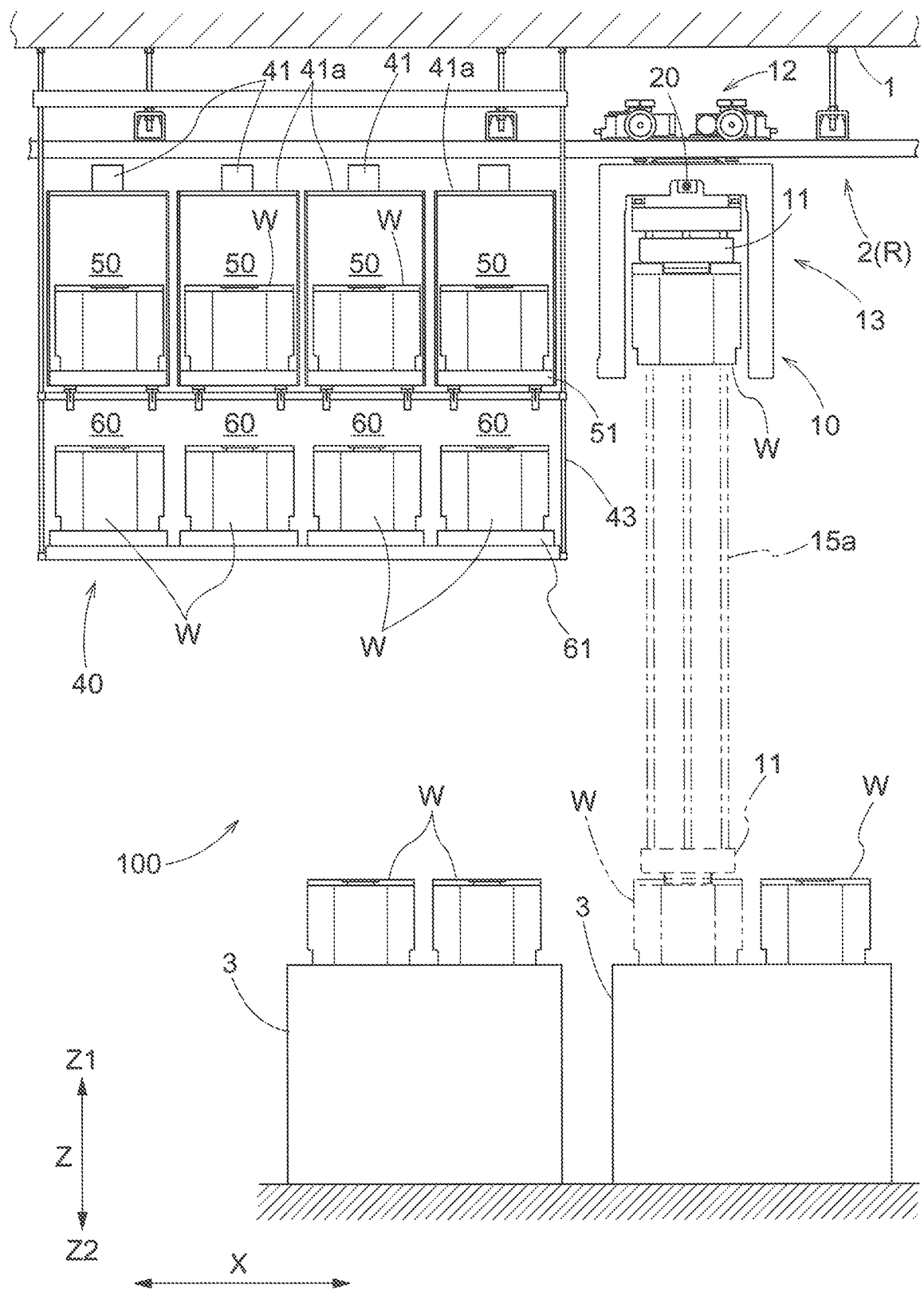
FIG. 1 is a diagram showing part of an article transport facility according to a first embodiment.
Figure 2:
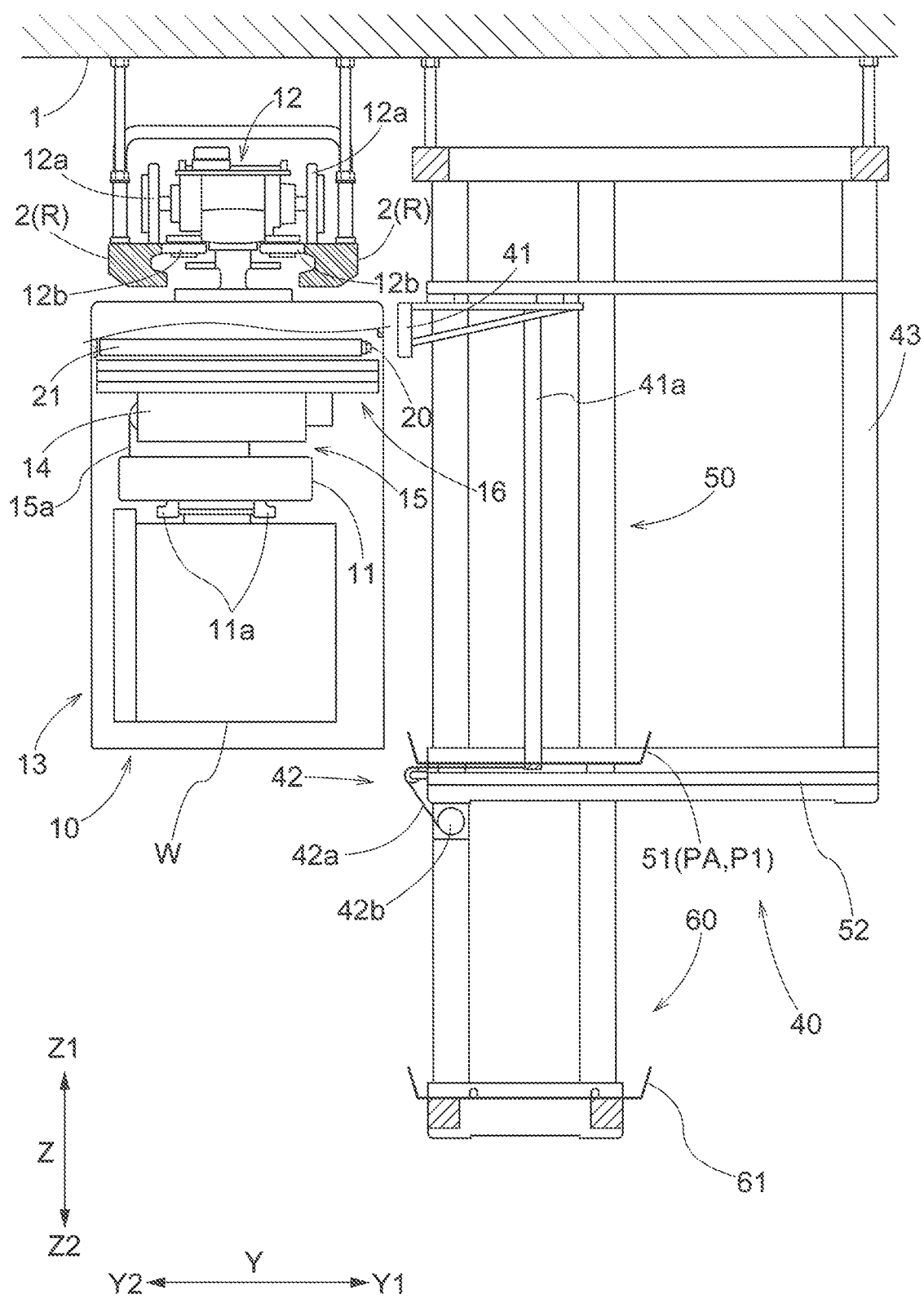
FIG. 2 is a diagram showing a transport device and a storage device according to the first embodiment.

As shown in FIG. 1, an article transport facility 100 includes a transport device 10 that moves along a movement path R to transport an article W, and a storage device 40 that stores the article W. Here, as shown in FIG. 1, it is assumed that the longitudinal direction (direction in which the movement path R extends) of the movement path R is a path longitudinal direction X. As shown in FIG. 2, it is also assumed that the width direction of the movement path R is a path width direction Y, the side where the storage device 40 is disposed relative to the movement path R in the path width direction Y is a first side Y1, a side opposite to the first side Y1 in the path width direction Y (i.e., a side where the movement path R is disposed relative to the storage device 40 in the path width direction Y) is a second side Y2. The path width direction Y is a direction orthogonal to both the path longitudinal direction X and an up-down direction Z (vertical direction). The path width direction Y is a horizontal direction. When the movement path R extends in a horizontal direction as shown in FIG. 1, the path longitudinal direction X is the horizontal direction.

The movement path R is formed by travel rails 2. Specifically, the movement path R is formed by a pair of travel rails 2 disposed spaced apart in the path width direction Y. As shown in FIGS. 1 and 2, in the present embodiment, the travel rails 2 are fixed to a ceiling 1 in a state of being suspended from and supported by the ceiling 1, and the transport device 10 moves along the movement path R formed along the ceiling 1. That is, the transport device 10 is a ceiling guided vehicle that travels along the travel rails 2 provided on the ceiling side.

As shown in FIG. 2, the storage device 40 is disposed adjacent to the movement path R. The storage device 40 is disposed adjacent to the movement path R on the first side Y1 in an up-down view (i.e., in a plan view) along the up-down direction Z. In the present embodiment, the storage device 40 is supported by the ceiling 1. Specifically, the storage device 40 includes an assembled frame 43 formed by coupling frame members together, and the assembled frame 43 is fixed to the ceiling 1 in a state of being suspended from and supported by the ceiling 1. Although the storage device 40 is disposed on one side relative to the movement path R in the path width direction Y in the configuration illustrated here, it is possible to adopt a configuration in which the storage devices 40 are disposed on both sides relative to the movement path R in the path width direction Y. In that case, the first side Y1 and the second side Y2 are defined with reference to each of the storage devices 40 disposed on both sides relative to the movement path R in the path width direction Y. That is, the first side Y1 for the storage device 40 disposed on one side relative to the movement path R in the path width direction Y, and the first side Y1 for the storage device 40 disposed on the other side relative to the movement path R in the path width direction Y are opposite to each other in the path width direction Y.

The storage device 40 includes a first storage section 50, and a second storage section 60 disposed below the first storage section 50. The first storage section 50 is disposed at a position located above the second storage section 60 and overlapping the second storage section 60 in a plan view. In the present embodiment, no other storage section is disposed between the first storage section 50 and the second storage section 60 in the up-down direction Z. That is, the second storage section 60 is disposed adjacent to the first storage section 50 on a lower side Z2. In the example shown in FIG. 1, a plurality of sets of the first storage sections 50 and second storage sections 60 arranged in the up-down direction Z are arranged in the path longitudinal direction X. Note that "above" is the direction toward an upper side Z1 in the up-down direction Z, and "below" is the direction toward the lower side Z2 in the up-down direction Z.

As shown in FIG. 2, the first storage section 50 includes a first support portion 51 that supports the article W, and the second storage section 60 includes a second support portion 61 that supports the article W. As shown in FIG. 1, in the present embodiment, the first support portion 51 and the second support portion 61 support the article W from the lower side Z2. The position of the second support portion 61 in the path width direction Y relative to the movement path R is fixed. The second support portion 61 is fixed to the assembled frame 43. On the other hand, the position of the first support portion 51 in the path width direction Y relative to the movement path R is not fixed. That is, the first storage section 50 includes a movable support portion 52 that movably supports the first support portion 51 in the path width direction Y. The movable support portion 52 movably supports the first support portion 51 in the path width direction Y relative to the assembled frame 43.

The movable support portion 52 movably supports the first support portion 51 in the path width direction Y while restricting movement of the first support portion 51 in directions orthogonal to the path width direction Y. For example, the movable support portion 52 can be formed using the following linear motion mechanism including a guide rail and a guide block that is guided and supported by the guide rail. The guide rail is fixed to the assembled frame 43 so as to extend along the path width direction Y. The guide block is engaged with the guide rail in a state in which relative movement thereof relative to the guide rail in the path width direction Y is allowed, and relative movement thereof relative to the guide rail in directions orthogonal to the path width direction Y is restricted. Also, the guide block is fixed to the first support portion 51. Accordingly, the first support portion 51 is supported by the assembled frame 43 via the movable support portion 52 in a state in which relative movement thereof relative to the assembled frame 43 in the path width direction Y is allowed, and relative movement thereof relative to the assembled frame 43 in directions orthogonal to the path width direction Y is restricted.

Figure 3:
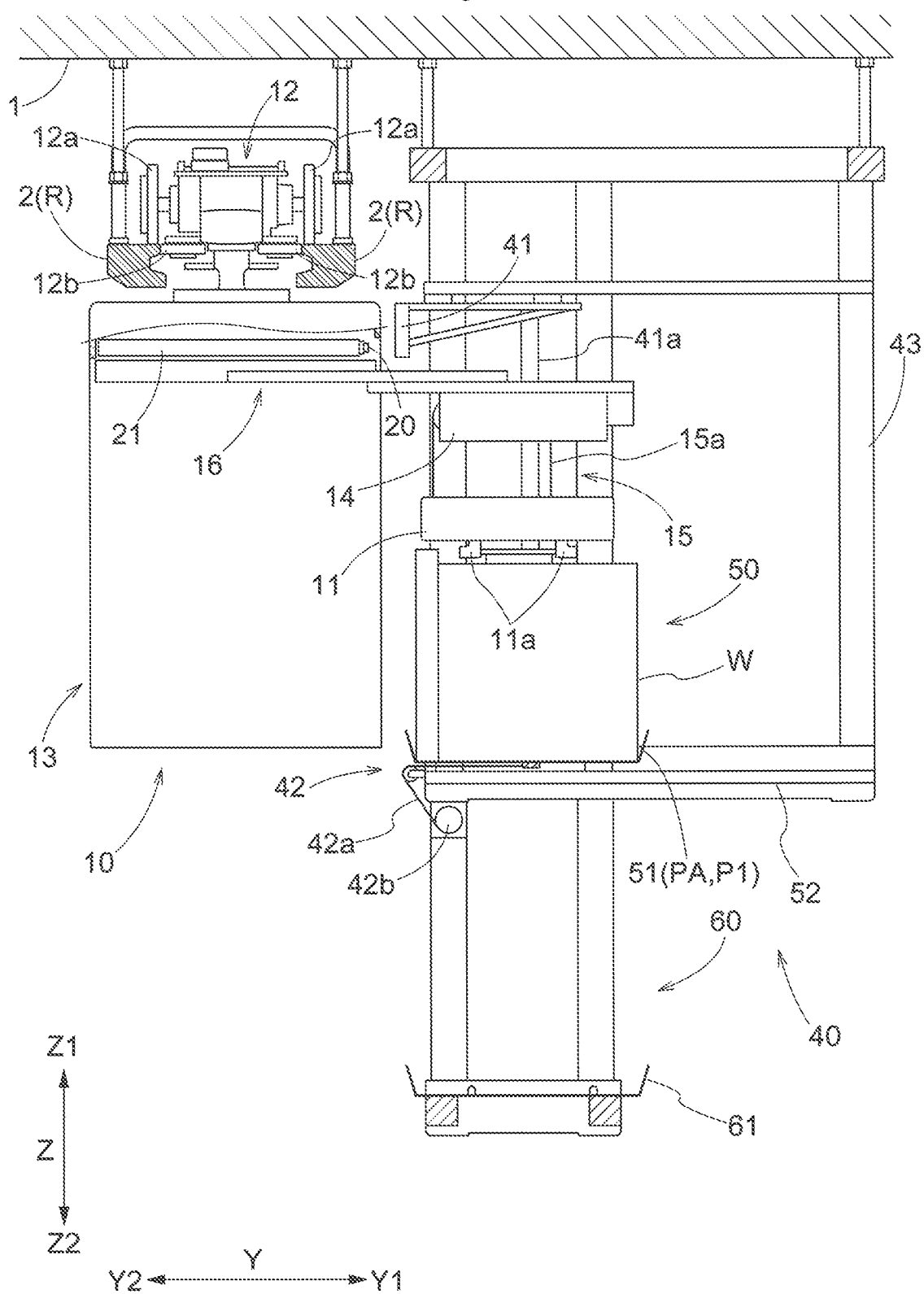
FIG. 3 is a diagram showing a situation where an article is transferred between a holding section and a first support portion in the article transport facility according to the first embodiment.
Figure 4:
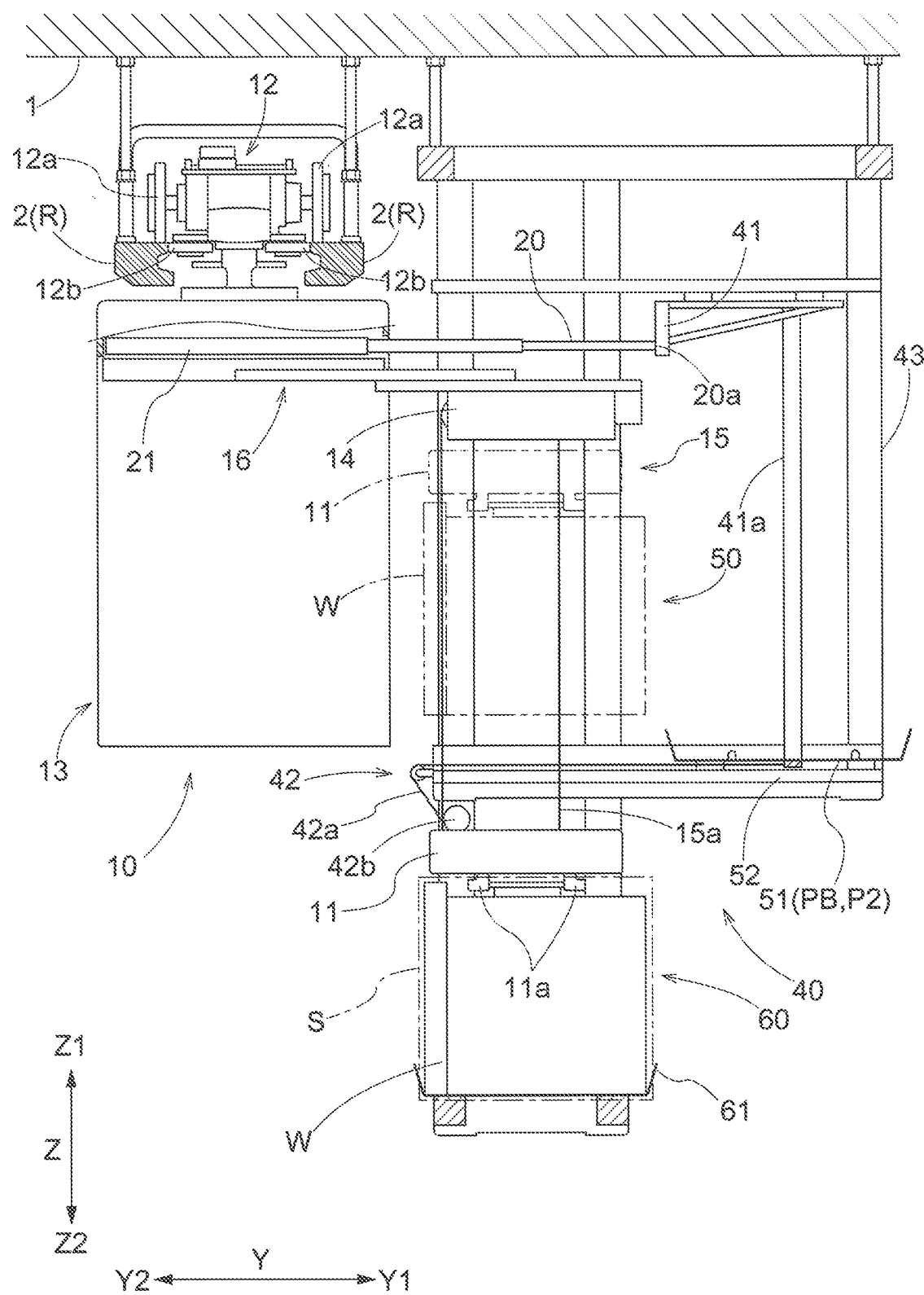
FIG. 4 is a diagram showing a situation where an article is transferred between the holding section and a second support portion in the article transport facility according to the first embodiment.

The range of movement of the first support portion 51 in the path width direction Y includes an overlapping position PA and a non-overlapping position PB. The overlapping position PA is the position of the first support portion 51 shown in FIGS. 2 and 3, and the non-overlapping position PB is the position of the first support portion 51 shown in FIG. 4. In the present embodiment, the first support portion 51 moves between the overlapping position PA and the non-overlapping position PB in the path width direction Y. As shown in FIG. 4, it is assumed that the space occupied by the article W in a state of being supported by the second support portion 61 is a target space S. The overlapping position PA is a position at which the first support portion 51 overlaps the target space S in the up-down view. The non-overlapping position PB is a position that is adjacent to the first side Y1 relative to the overlapping position PA, and at which the first support portion 51 does not overlap the target space S in the up-down view. As will be described below, the transport device 10 is provided with an operation section 20 that acts on the storage device 40 by coming into contact therewith so as to switch the position of the first support portion 51 between the overlapping position PA and the non-overlapping position PB.

As shown in FIG. 2, the transport device 10 includes a holding section 11 that holds the article W. In the present embodiment, the holding section 11 holds the article W from the upper side Z1. In the present embodiment, the article W is a container that accommodates semiconductor wafers, and specifically is a front opening unified pod (FOUP). The holding section 11 includes gripping portions 11a (here, a pair of gripping portions 11a) that grip a flange portion formed on an upper part of the article W, and uses the gripping portions 11a to hold an article W. The transport device 10 includes a gripping motor 34 (an example of a driving power source; see FIG. 5) that switches the state of the gripping portions 11a. As a result of the gripping motor 34 being driven, the state of the gripping portions 11a is switched between a gripping state for gripping the article W and a grip released state for releasing the grip on the article W.

The transport device 10 includes a travel portion 12 that travels along the movement path R. The travel portion 12 travels along travel rails 2 (here, a pair of travel rails 2). As shown in FIG. 2, the travel portion 12 includes travel wheels 12a that roll on the travel rails 2. The transport device 10 (specifically, the travel portion 12) includes a travel motor 31 (an example of the driving power source; see FIG. 5) that drives the travel wheels 12a, and the travel portion 12 travels along the travel rails 2 as a result of the travel wheels 12a being driven by the travel motor 31. The travel portion 12 includes guide wheels 12b that guide the traveling of the travel portion 12 along the travel rails 2, and the travel portion 12 travels along the travel rails 2 in a state in which the guide wheels 12b are in contact with and guided by side surfaces of the travel rails 2.

The transport device 10 includes a body portion 13 coupled to the travel portion 12. The holding section 11 is provided in the body portion 13, and an elevation mechanism 15 and a movement mechanism 16, which will be described below, are also provided in the body portion 13. In the present embodiment, the body portion 13 is suspended from and supported by the travel portion 12 in a state of being disposed below the travel rail 2.

The transport device 10 includes the elevation mechanism 15 for elevating and lowering the holding section 11. By lowering and elevating the holding section 11 using the elevation mechanism 15, the relative position of the holding section 11 relative to the travel portion 12 in the up-down direction Z is changed. The elevation mechanism 15 elevates and lowers the holding section 11 between a traveling height that is the height of the travel portion 12 when traveling, and a transfer height that is the height at which the article W is transferred to a transfer target location. The transfer height is set according to the height of each transfer target location. In FIG. 1, the holding section 11 located at the traveling height is indicated by the solid line, and the holding section 11 located at the transfer height corresponding to a support platform 3 acting as a transfer target location is indicated by the dashed double-dotted line. The support platform 3 is used, for example, as a port (a load port or the like) where at least one of loading and unloading of the article W is performed at a processing device that handles the article W as a processing target. FIG. 2 shows the holding section 11 located at the traveling height, and FIG. 3 shows the holding section 11 located at the transfer height corresponding to the first storage section 50 (specifically, the first support portion 51) acting as the transfer target location. In FIG. 4, the holding section 11 located at the traveling height is indicated by the dashed double-dotted line, and the holding section 11 located at the transfer height corresponding to the second storage section 60 (specifically, the second support portion 61) as the transfer target location is indicated by the solid line.

In the present embodiment, the elevation mechanism 15 elevates and lowers the holding section 11 in a state in which the holding section 11 is suspended and supported. Specifically, the holding section 11 is coupled to a distal end portion of the transmission member 15a, which is a belt, wire, or the like, and the transport device 10 (specifically, the body portion 13) includes an elevation motor 32 (an example of the driving power source; see FIG. 5) that rotates a winding member (not shown) around which the transmission member 15a is wound. The elevation mechanism 15 elevates or lowers the holding section 11 by causing the elevation motor 32 to rotate the winding member so as to wind or unwind the transmission member 15a.

The transport device 10 includes the movement mechanism 16 for moving the holding section 11 along the path width direction Y. As a result of the movement mechanism 16 moving the holding section 11 in the path width direction Y, the relative position of the holding section 11 relative to the travel portion 12 in the path width direction Y is changed. The movement mechanism 16 moves the holding section 11 along the path width direction Y between a retracted position (see FIG. 2) that is the position of the holding section 11 assumed when the travel portion 12 is traveling, and a protruding position (see FIGS. 3 and 4) located on the first side Y1 relative to the retracted position. As shown in FIG. 2, the retracted position is a position at which the holding section 11 overlaps the travel portion 12 in the up-down view. The transport device 10 (specifically, the body portion 13) includes a moving motor 33 (an example of the driving power source; see FIG. 5), and the movement mechanism 16 moves the holding section 11 in the path width direction Y, using the driving force of the moving motor 33.

In the present embodiment, the movement mechanism 16 moves the elevation mechanism 15 along the path width direction Y, thus moving the holding section 11 supported by the elevation mechanism 15 in the path width direction Y.

Specifically, the elevation mechanism 15 is configured to elevate and lower the holding section 11 relative to the support portion 14. That is, the holding section 11 is supported by the support portion 14, and is suspended from and supported by the support portion 14 in the present embodiment. The movement mechanism 16 movably supports the support portion 14 in the path width direction Y, while restricting the movement of the support portion 14 in directions orthogonal to the path width direction Y. Also, the movement mechanism 16 is configured to move the support portion 14 along the path width direction Y, thus moving, along the path width direction Y, the holding section 11 in the state of being supported by the support portion 14. The movement mechanism 16 moves the support portion 14 in the path width direction Y, using the driving force of the moving motor 33. The movement mechanism 16 is formed using, for example, a slide mechanism (e.g., a three-stage slide mechanism) for slidably supporting the support portion 14 in the path width direction Y.

Figure 5:
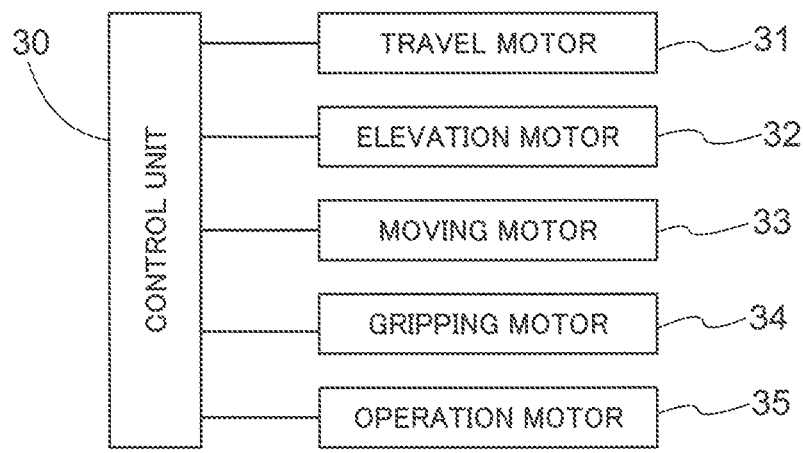
FIG. 5 is a control block diagram according to the first embodiment.

The article transport facility 100 includes a control unit 30 that controls the transport device 10. The control unit 30 includes an arithmetic processing device such as a CPU, and also includes a peripheral circuit such as a memory. Various functions of the control unit 30 are implemented by these pieces of hardware working cooperatively with a program executed on hardware such as the arithmetic processing device. As shown in FIG. 5, the control unit 30 controls the driving of each of the travel motor 31, the elevation motor 32, the moving motor 33, and the gripping motor 34 described above, and also controls the driving of an operation motor 35, which will be described below.

When transferring the article W between the transport device 10 (specifically, the holding section 11) and a transfer target location, the control unit 30 controls the driving of the travel motor 31 to cause the travel portion 12 to travel to a transferring position corresponding to the transfer target location. The movement path R is formed so as to pass through the transferring position corresponding to each of the transfer target locations. When the travel portion 12 is traveling, the holding section 11 is disposed at the retracted position at the traveling height (see FIG. 2). When the transfer target location is disposed at a position overlapping the movement path R in the up-down view, the control unit 30 controls, in a state in which the travel portion 12 is stopped at the transferring position, the driving of the elevation motor 32 so as to cause the elevation mechanism 15 to lower the holding section 11 from the traveling height to the transfer height. On the other hand, when the transfer target location is disposed on the first side Y1 relative to the movement path R in the up-down view, the control unit 30 controls, in a state in which the travel portion 12 is stopped at the transferring position, the driving of the moving motor 33 so as to cause the movement mechanism 16 to move the holding section 11 to the first side Y1 from the retracted position to the protruding position (specifically, the position at which the holding section 11 overlaps the transfer target location in the up-down view), and subsequently controls the driving of the elevation motor 32 so as to cause the elevation mechanism 15 to lower the holding section 11 from the traveling height to the transfer height (see FIGS. 3, 4).

The control unit 30 controls, in a state in which the holding section 11 is lowered to the transfer height, the driving of the gripping motor 34 so as to switch the state of the gripping portions 11a. When transferring the article W from the transport device 10 to a transfer target location, the control unit 30 switches the state of the gripping portions 11a from the gripping state to the grip released state. When transferring the article W from the transfer target location to the transport device 10, the control unit 30 switches the state of the gripping portions 11a from the grip released state to the gripping state. Then, the control unit 30 controls the driving of the elevation motor 32 so as to make the elevation mechanism 15 elevate the holding section 11 from the transfer height to the traveling height. When the transfer target location is disposed on the first side Y1 relative to the movement path R in the up-down view, the control unit 30 controls, in a state in which the holding section 11 is elevated to the traveling height, the driving of the moving motor 33 so as to cause the movement mechanism 16 to move the holding section 11 to the second side Y2 from the protruding position to the retracted position. As a result of the control unit 30 performing the above-described control, when the article W is transferred from the transport device 10 to the transfer target location, the article W held by the holding section 11 of the transport device 10 is unloaded at the transfer target location. When the article W is transferred from the transfer target location to the transport device 10, the article W placed at the transfer target location is held by the holding section 11 and is removed from the transfer target location.

The storage device 40 is disposed adjacent to the first side Y1 relative to the movement path R in the up-down view. Accordingly, when the article W is transferred between the transport device 10 (specifically, the holding section 11) and the storage device 40, the storage device 40, which is the transfer target location, is disposed on the first side Y1 relative to the movement path R in the up-down view. Accordingly, the control unit 30 causes the elevation mechanism 15 to elevate and lower the holding section 11 between the traveling height and the transfer height in a state in which the holding section 11 has been moved to the first side Y1 from the retracted position to the protruding position (specifically, the position at which the holding section 11 overlaps the storage device 40 in the up-down view) by the movement mechanism 16. That is, the transport device 10 is configured to cause the movement mechanism 16 to cause the holding section 11 to protrude to the first side Y1 when transferring the article W between the holding section 11 and the storage device 40. Here, "to protrude to the first side Y1" means to protrude to the first side Y1 relative to the movement path R or the travel portion 12.

When transferring the article W between the holding section 11 and the first storage section 50, the transport device 10 causes the movement mechanism 16 to cause the holding section 11 to protrude to the first side Y1 to a position at which the holding section 11 overlaps the first support portion 51 disposed at the overlapping position PA in the up-down view (hereinafter referred to as a "first protruding position"), as shown in FIG. 3. Then, the transport device 10 elevates and lowers the holding section 11 in the state of being disposed at the first protruding position, between the traveling height and the transfer height (the height of the holding section 11 shown in FIG. 3) corresponding to the first support portion 51, thus transferring the article W between the holding section 11 and the first storage section 50 (specifically, the first support portion 51). When transferring the article W between the holding section 11 and the second storage section 60, the transport device 10 causes the movement mechanism 16 to cause the holding section 11 to protrude to the first side Y1 to a position at which the holding section 11 overlaps the second support portion 61 in the up-down view (hereinafter referred to as a "second protruding position"), as shown in FIG. 4. Then, the transport device 10 elevates and lowers the holding section 11 in the state of being disposed at the second protruding position, between the traveling height (the height of the holding section 11 indicated by the dashed double-dotted line in FIG. 4) and the transfer height (the height of the holding section 11 indicated by the solid line in FIG. 4) corresponding to the second support portion 61, thus transferring the article W between the holding section 11 and the second storage section 60 (specifically, the second support portion 61).

In the present embodiment, the overlapping position PA is set such that the first protruding position is at the same position as the second protruding position in the path width direction Y. That is, the overlapping position PA is set at the same position as the second support portion 61 in the path width direction Y. Accordingly, the amount of protrusion of the holding section 11 to the first side Y1 caused by the movement mechanism 16 (i.e., the amount of movement from the retracted position to the first side Y1) when transferring the article W between the holding section 11 and the first storage section 50 is equal to the amount of protrusion of the holding section 11 to the first side Y1 caused by the movement mechanism 16 when transferring the article W between the holding section 11 and the second storage section 60.

As shown in FIGS. 2 to 4, the transport device 10 includes the operation section 20 that acts on the storage device 40 by coming into contact therewith so as to switch the position of the first support portion 51 between the overlapping position PA and the non-overlapping position PB. By providing the transport device 10 with the operation section 20, when transferring the article W between the holding section 11 and the second storage section 60, the first support portion 51 can be disposed at the non-overlapping position PB, and the first support portion 51 or the article W supported by the first support portion 51 can be retracted from the elevation path of the holding section 11 or the article W held by the holding section 11, as will be described below.

One or both of the switching of the position of the first support portion 51 from the overlapping position PA to the non-overlapping position PB, and the switching of the position of the first support portion 51 from the non-overlapping position PB to the overlapping position PA are performed via a contact action performed on the storage device 40 by the operation section 20. In the present embodiment, only one of these two types of switching is performed via a contact action performed on the storage device 40 by the operation section 20. Specifically, assuming that one of the overlapping position PA and the non-overlapping position PB is a first position P1, and the other is a second position P2, the first support portion 51 is configured to be disposed at the first position P1 in a state in which the first support portion 51 is not operated by the operation section 20. Then, the switching of the position of the first support portion 51 from the first position P1 to the second position P2 is performed via a contact action performed on the storage device 40 by the operation section 20.

As shown in FIGS. 2 to 4, in the present embodiment, the transport device 10 includes an operation mechanism 21 that moves the operation section 20 separately from the holding section 11 along the path width direction Y. The transport device 10 (specifically, the body portion 13) includes an operation motor 35 (an example of the driving power source; see FIG. 5), and the operation mechanism 21 moves the operation section 20 in the path width direction Y using the driving force of the operation motor 35. The operation mechanism 21 is formed, for example, using a slide mechanism (e.g., a three-stage slide mechanism) for slidably supporting the operation section 20 in the path width direction Y.

As shown in FIG. 4, the operation section 20 is configured to press a pressed portion 41 provided in the storage device 40 toward the first side Y1 as the operation section 20 moves to the first side Y1. An end portion of the operation section 20 on the first side Y1 constitutes a pressing portion 20a that presses the pressed portion 41 toward the first side Y1. As shown in FIGS. 1 and 3, in the present embodiment, the pressed portion 41 is disposed above the article W supported by the first support portion 51. Also, the first storage section 50 is configured such that the first support portion 51 moves from the first position P1 to the second position P2 as the pressed portion 41 is pressed toward the first side Y1, and that the first support portion 51 moves from the second position P2 to the first position P1 as the pressing on the pressed portion 41 toward the first side Y1 is released. In the present embodiment, the operation section 20 is configured to constantly press the pressed portion 41 toward the first side Y1 as the operation section 20 moves toward the first side Y1. Accordingly, as the operation section 20 moves toward the first side Y1, the first support portion 51 constantly moves from the first position P1 toward the second position P2 in the path width direction Y.

In the present embodiment, the pressed portion 41 is provided so as to move integrally with the first support portion 51 in the path width direction Y. Specifically, as shown in FIGS. 1 and 2, the pressed portion 41 is coupled to the first support portion 51 by a coupling member 41a. Accordingly, the first support portion 51 moves from the overlapping position PA to the non-overlapping position PB as the pressed portion 41 is pressed toward the first side Y1 by the operation section 20. That is, in the present embodiment, the first position P1 is the overlapping position PA, and the second position P2 is the non-overlapping position PB. Thus, in a normal state in which the pressing on the pressed portion 41 toward the first side Y1 is released, the first support portion 51 is disposed at the overlapping position PA, as shown in FIG. 2.

As described above, the first support portion 51 moves from the second position P2 (the non-overlapping position PB in the present embodiment) to the first position P1 (the overlapping position PA in the present embodiment) as the pressing on the pressed portion 41 toward the first side Y1 by the operation section 20 is released. In the present embodiment, the storage device 40 is configured to generate at least part of the force for moving the first support portion 51 from the second position P2 to the first position P1, using one or both of the weight of the first support portion 51 and a biasing force exerted by a biasing mechanism 42. Here, the storage device 40 is configured to generate all of the force for moving the first support portion 51 from the second position P2 to the first position P1, using the biasing force exerted by the biasing mechanism 42.

In the example shown in FIGS. 2 to 4, the biasing mechanism 42 includes a wire 42a to which one end of the first support portion 51 is coupled, a drum 42b around which the wire 42a is wound, and a biasing member (not shown) such as a spring that biases the drum 42b in a direction in which the wire 42a is wound. When the first support portion 51 moves from the overlapping position PA to the non-overlapping position PB, the pressing force exerted on the pressed portion 41 toward the first side Y1 by the operation section 20 causes the wire 42a to be let out from the drum 42b against the biasing force of the biasing member (see FIG. 4). When the pressing on the pressed portion 41 toward the first side Y1 by the operation section 20 is released, the biasing force of the biasing member causes the wire 42a to be wound around the drum 42b, and the first support portion 51 moves from the non-overlapping position PB to the overlapping position PA (see FIG. 3).

In the present embodiment, the control unit 30 is configured to control the state of an operation performed by the operation section 20 on the first support portion 51 such that the first support portion 51 is disposed at the overlapping position PA when the article W is transferred between the holding section 11 and the first support portion 51, and that the first support portion 51 is disposed at the non-overlapping position PB when the article W is transferred between the holding section 11 and the second support portion 61. The control unit 30 controls the driving of the operation motor 35 so as to control the state of the operation performed by the operation section 20 on the first support portion 51 by the operation mechanism 21.

As described above, in the present embodiment, the first support portion 51 is disposed at the overlapping position PA in a normal state in which the pressing on the pressed portion 41 toward the first side Y1 is released. Accordingly, when the article W is transferred between the holding section 11 and the first support portion 51, the control unit 30 disposes the first support portion 51 at the overlapping position PA (i.e., keeps the first support portion 51 disposed at the overlapping position PA) as shown in FIG. 3 by keeping the operation section 20 at the position (see FIG. 2) of the operation section 20 assumed when the travel portion 12 is traveling. On the other hand, when the article W is transferred between the holding section 11 and the second support portion 61, the control unit 30 disposes the first support portion 51 at the non-overlapping position PB by moving the operation section 20 to the first side Y1 from the position (see FIG. 2) of the operation section 20 assumed when the travel portion 12 is traveling, to the position at which the first support portion 51 is disposed at the non-overlapping position PB, as shown in FIG. 4. When the article W is transferred between the holding section 11 and the second support portion 61, the control unit 30 causes the operation mechanism 21 to move the operation section 20 to the first side Y1 with (in synchronization with) the protruding movement of the holding section 11 toward the first side Y1 caused by the movement mechanism 16, or causes the operation mechanism 21 to move the operation section 20 to the first side Y1 before the protruding movement of the holding section 11 to the first side Y1 caused by the movement mechanism 16.

Second Embodiment

An embodiment of an article transport facility according to a second embodiment will be described with reference to the drawings. The following description of the article transport facility according to the present embodiment focuses on the differences from the first embodiment. Components that are not specifically described are the same as those of the first embodiment, and are denoted by the same reference numerals, with detailed descriptions thereof omitted.

Figure 6:
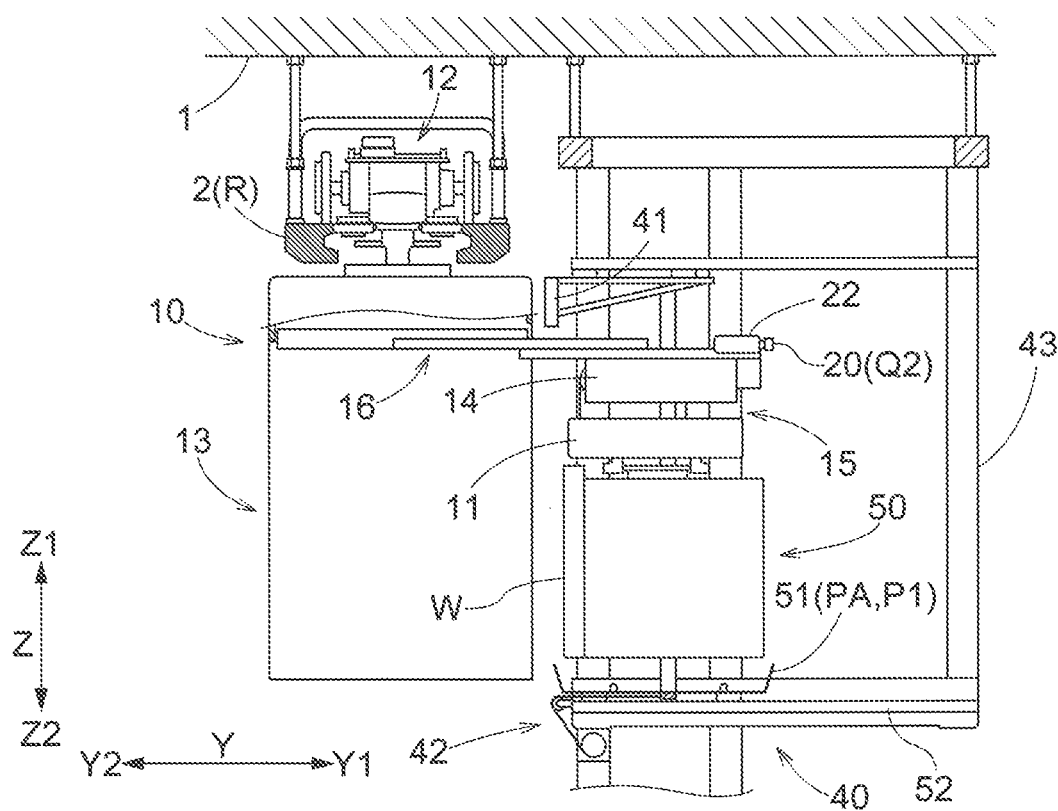
FIG. 6 is a diagram showing a situation where an article is transferred between a holding section and a first support portion in an article transport facility according to a second embodiment.
Figure 7:
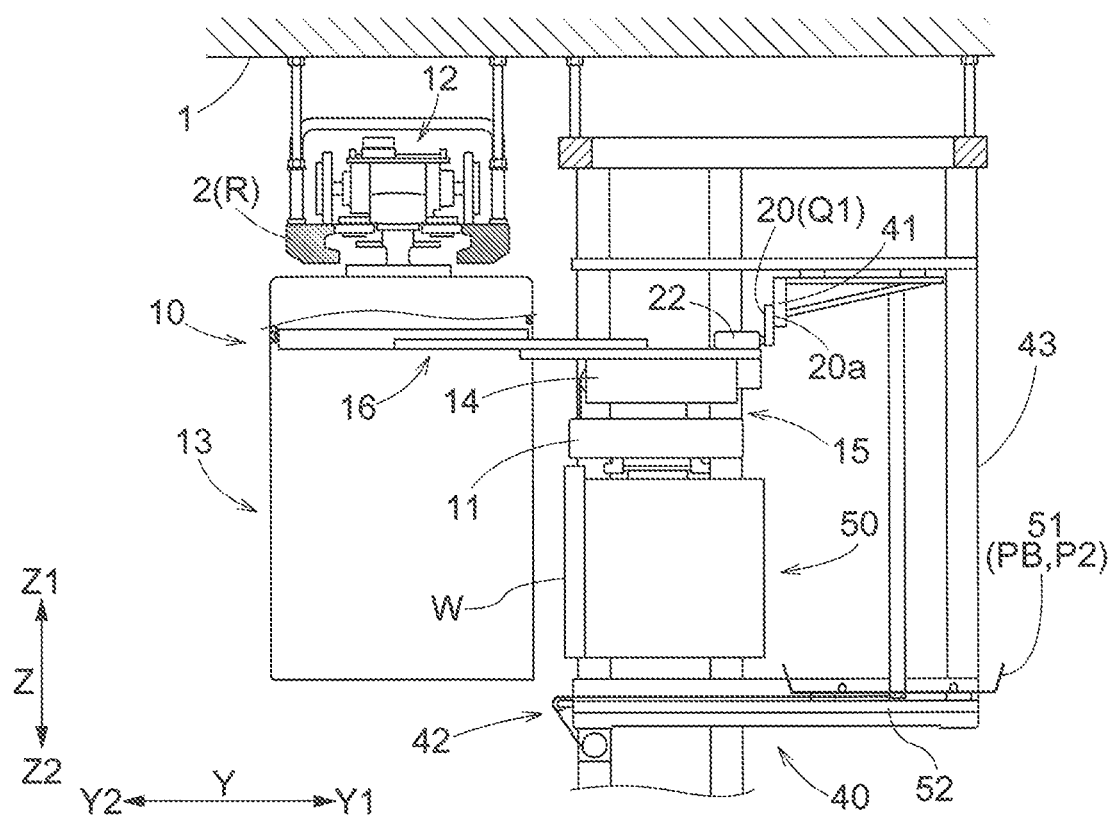
FIG. 7 is a diagram showing a situation where an article is transferred between the holding section and a second support portion in the article transport facility according to the second embodiment.

In the first embodiment, the transport device 10 includes the operation mechanism 21 that moves the operation section 20 separately from the holding section 11 along the path width direction Y. However, in the present embodiment, as shown in FIGS. 6 and 7, the operation section 20 is configured to move to the same side as the side to which the holding section 11 moves in the path width direction Y as the holding section 11 moves in the path width direction Y.

Specifically, the operation section 20 is coupled to the support portion 14 so as to move integrally with the support portion 14 in the path width direction Y, and the movement mechanism 16 is configured to move the holding section 11 and the operation section 20 along the path width direction Y by moving the support portion 14 along the path width direction Y.

In the present embodiment, the article transport facility 100 includes a switching mechanism 22 for switching the state of an operation performed by the operation section 20 on the first support portion 51 between an enabled state (the state shown in FIG. 7) in which the first support portion 51 moves from the first position P1 to the second position P2 as the operation section 20 moves toward the first side Y1, and a disabled state (the state shown in FIG. 6) in which the first support portion 51 is kept at the overlapping position PA or the non-overlapping position PB, regardless of whether or not the operation section 20 moves toward the first side Y1. In the present embodiment, the first support portion 51 is kept at the overlapping position PA in the disabled state. The switching mechanism 22 switches the state of the operation performed by the operation section 20 on the first support portion 51 between the enabled state and the disabled state, using the driving force of the operation motor 35 (an example of the driving power source; see FIG. 5).

In the present embodiment, as in the first embodiment, the control unit 30 is configured to control the state of an operation performed by the operation section 20 on the first support portion 51 such that the first support portion 51 is disposed at the overlapping position PA when the article W is transferred between the holding section 11 and the first support portion 51, and that the first support portion 51 is disposed at the non-overlapping position PB when the article W is transferred between the holding section 11 and the second support portion 61. The control unit 30 controls the driving of the operation motor 35 to control the state of the operation performed by the operation section 20 on the first support portion 51 by the switching mechanism 22.

Specifically, the control unit 30 switches the state of the operation performed by the operation section 20 on the first support portion 51 between the enabled state and the disabled state by switching the orientation of the operation section 20. The orientation of the operation section 20 is switched by the switching mechanism 22, using the driving force of the operation motor 35. That is, the control unit 30 controls the driving of the operation motor 35 to switch the orientation of the operation section 20 by using the switching mechanism 22. The operation section 20 is configured such that the orientation thereof is switchable between a pressing orientation Q1 (see FIG. 7) for pressing the pressed portion 41 toward the first side Y1 as the operation section 20 moves to the first side Y1, and a non-pressing orientation Q2 (see FIG. 6) that is not the pressing orientation Q1. The control unit 30 switches the state of an operation performed by the operation section 20 on the first support portion 51 to the enabled state by switching the orientation of the operation section 20 to the pressing orientation Q1, and switches the state of an operation performed by the operation section 20 on the first support portion 51 to the disabled state by switching the orientation of the operation section 20 to the non-pressing orientation Q2. In the example shown in FIGS. 6 and 7, the switching mechanism 22 switches the orientation of the operation section 20 between the pressing orientation Q1 and the non-pressing orientation Q2 by rotating the operation section 20 about a rotation axis extending along the path width direction Y.

In the present embodiment, as in the first embodiment, the first storage section 50 is configured such that the first support portion 51 moves from the first position P1 to the second position P2 as the pressed portion 41 is pressed toward the first side Y1, and that the first support portion 51 moves from the second position P2 to the first position P1 as the pressing on the pressed portion 41 toward the first side Y1 is released. Also, the first position P1 is the overlapping position PA, and the second position P2 is the non-overlapping position PB. The first support portion 51 is disposed at the overlapping position PA in a normal state in which the pressing on the pressed portion 41 toward the first side Y1 is released.

Thus, when the article W is transferred between the holding section 11 and the first support portion 51, the control unit 30 switches the state of an operation performed by the operation section 20 on the first support portion 51 to the disabled state by using the switching mechanism 22, as shown in FIG. 6. Accordingly, the first support portion 51 is kept at the overlapping position PA even when the operation section 20 has moved to the first side Y1 as a result of the protruding movement of the holding section 11 to the first side Y1 caused by the movement mechanism 16. That is, the first support portion 51 is disposed at the overlapping position PA. On the other hand, when the article W is transferred between the holding section 11 and the second support portion 61, the control unit 30 switches the state of the operation performed by the operation section 20 on the first support portion 51 to the enabled state by using the switching mechanism 22, as shown in FIG. 7. Accordingly, when the operation section 20 moves to the first side Y1 as a result of the protruding movement of the holding section 11 to the first side Y1 caused by the movement mechanism 16, the first support portion 51 moves from the overlapping position PA to the non-overlapping position PB. That is, the first support portion 51 is disposed at the non-overlapping position PB.

Other Embodiments

Next, other embodiments of the article transport facility will be described.

(1) The second embodiment was described, taking, as an example, a configuration in which the control unit 30 switches the state of the operation performed by the operation section 20 on the first support portion 51 between the enabled state and the disabled state by switching the orientation of the operation section 20. However, the present disclosure is not limited to such a configuration, and it is also possible to adopt a configuration in which the control unit 30 or another control unit (e.g., a host control unit of the control unit 30) switches the state of the operation performed by the operation section 20 on the first support portion 51 between the enabled state and the disabled state by switching the orientation of the pressed portion 41, rather than the orientation of the operation section 20. In this case, the pressed portion 41 is configured such that the orientation thereof is switchable between a pressed orientation in which the pressed portion 41 is pressed toward the first side Y1 by the operation section 20 moving in the first side Y1, and a disabled orientation that is not the pressed orientation. Then, the control unit 30 or another control unit switches the state of the operation performed by the operation section 20 on the first support portion 51 to the enabled state by switching the orientation of the pressed portion 41 to the pressed orientation, and switches the state of the operation per- formed by the operation section 20 on the first support portion 51 to the disabled state by switching the orientation of the pressed portion 41 to the disabled orientation. In this case, the storage device 40 is provided with a switching mechanism for switching the orientation of the pressed portion 41, and the control unit 30 or another control unit switches the orientation of the pressed portion 41 by using the switching mechanism by controlling the driving of a motor (an example of the driving power source).

Note that it is also possible to adopt a configuration in which the switching of the orientation of the pressed portion 41 by the switching mechanism is performed using, for example the weight of the article W supported by the first support portion 51, rather than by control performed by the control unit 30 or another control unit. That is, the control or switching of the state of the operation performed by the operation section 20 on the first support portion 51 may be performed mechanically, rather than by control performed by the control unit 30 or another control unit.

(2) The above embodiments were described, taking, as an example, a configuration in which the pressed portion 41 is provided so as to move integrally with the first support portion 51 in the path width direction Y. However, the present disclosure is not limited to such a configuration, and it is also possible to adopt a configuration in which the pressed portion 41 does not move integrally with the first support portion 51 in the path width direction Y. In this case, it is possible to adopt a configuration in which the pressed portion 41 and the first support portion 51 are coupled via a link mechanism, for example. This link mechanism may be configured such that the first support portion 51 moves from the non-overlapping position PB to the overlapping position PA as the pressed portion 41 is pressed toward the first side Y1 by the operation section 20, and that the first support portion 51 moves from the overlapping position PA to the non-overlapping position PB as the pressing on the pressed portion 41 toward the first side Y1 by the operation section 20 is released. In this case, unlike the embodiments described above, the non-overlapping position PB is the first position P1, and the overlapping position PA is the second position P2.

Thus, when the non-overlapping position PB is the first position P1, and the overlapping position PA is the second position P2, the first support portion 51 is disposed at the non-overlapping position PB in a normal state in which the pressing on the pressed portion 41 toward the first side Y1 is released (i.e., in a state in which the first support portion 51 is not operated by the operation section 20). Then, the state of the operation performed by the operation section 20 on the first support portion 51 is controlled or switched such that the first support portion 51 moves from the non-overlapping position PB to the overlapping position PA when the article W is transferred between the holding section 11 and the first support portion 51, and that the first support portion 51 is kept at the non-overlapping position PB when the article W is transferred between the holding section 11 and the second support portion 61.

(3) The above embodiments were described, taking, as an example, a configuration in which all of the force for moving the first support portion 51 from the second position P2 to the first position P1 is generated by the biasing force exerted by the biasing mechanism 42. However, the present disclosure is not limited to such a configuration, and it is also possible to adopt a configuration in which all of the force for moving the first support portion 51 from the second position P2 to the first position P1 is generated by the weight of the first support portion 51, or a configuration in which all of the force for moving the first support portion 51 from the second position P2 to the first position P1 is generated by the biasing force exerted by the biasing mechanism 42 and the weight of the first support portion 51 working together. For example, in the case where the movable support portion 52 is configured using a linear motion mechanism including a guide rail and a guide block as described above, the force for moving the first support portion 51 from the second position P2 to the first position P1 can be generated by the weight of the first support portion 51 by adopting a configuration in which the guide rail is fixed to the assembled frame 43 in an orientation in which the guide rail is inclined toward the lower side Z2 as it extends toward the second side Y2.

(4) The above embodiments were described, taking, as an example, a configuration in which only one of the switching of the position of the first support portion 51 from the overlapping position PA to the non-overlapping position PB and the switching of the position of the first support portion 51 from the non-overlapping position PB to the overlapping position PA is performed by the action by contact by the operation section 20 on the storage device 40. However, the present disclosure is not limited to such a configuration, and it is also possible to adopt a configuration in which both of these two types of switching are performed by the action by contact by the operation section 20 on the storage device 40. Specifically, it is possible to adopt a configuration in which, assuming that one of the overlapping position PA and the non-overlapping position PB is a first position P1, and the other is a second position P2, the first support portion 51 moves from the first position P1 to the second position P2 as the operation section 20 presses the pressed portion 41 toward the first side Y1, and the first support portion 51 moves from the second position P2 to the first position P1 as the operation section 20 presses the pressed portion 41 toward the second side Y2. In this case, the force for moving the first support portion 51 from the second position P2 to the first position P1 does not need to be generated by the weight of the first support portion 51 or the biasing force exerted by the biasing mechanism 42.

(5) The above embodiments were described, taking, as an example, a configuration in which no other storage section is disposed between the first storage section 50 and the second storage section 60 in the up-down direction Z. However, the present disclosure is not limited to such a configuration, and it is also possible to adopt a configuration in which the storage device 40 includes one or more other storage sections (hereinafter referred to as "intermediate storage sections") between the first storage section 50 and the second storage section 60 in the up-down direction Z. In this case, for example, it is possible to adopt the following configuration. The intermediate storage section includes an intermediate support portion that supports the article W, and the intermediate support portion is movably supported in the path width direction Y, as in the case of the first support portion 51. In addition, the storage device 40 is provided with a coupling mechanism for selectively coupling the intermediate support portion to the first support portion 51. Then, when the article W is transferred between the holding section 11 and the second support portion 61, the intermediate support portion is coupled to the first support portion 51 by the coupling mechanism, whereby the intermediate support portion is moved integrally with the first support portion 51 from the overlapping position PA to the non-overlapping position PB. On the other hand, when the article W is transferred between the holding section 11 and the intermediate support portion, the coupling of the intermediate support portion to the first support portion 51 by the coupling mechanism is released, whereby the intermediate support portion is kept at the position at which the intermediate support portion overlaps the target space S in the up-down view, and only the first support portion 51 is moved from the overlapping position PA to the non-overlapping position PB.

(6) The above embodiments were described, taking, as an example, a configuration in which the storage device 40 is supported by the ceiling 1. However, the present disclosure is not limited to such a configuration, and it is also possible to adopt a configuration in which the storage device 40 is supported by a wall or a floor, for example.

(7) The above embodiments were described, taking, as an example, a configuration in which the body portion 13 is suspended from and supported by the travel portion 12. However, the present disclosure is not limited to such a configuration, and it is also possible to adopt a configuration in which the body portion 13 is supported by the travel portion 12 from the lower side Z2.

(8) The above embodiments were described taking, as an example, a configuration in which the transport device 10 moves along the movement path R formed along the ceiling 1. However, the present disclosure is not limited to such a configuration, and it is also possible to adopt a configuration in which the transport device 10 moves along the movement path R formed along a floor, for example. In this case, the movement path R is formed, for example, by a travel rail formed on the floor. Note that the movement path R may be formed without using a travel rail, or may be set virtually.

(9) The above embodiments were described taking, as an example, a configuration in which the article W is a container that accommodates semiconductor wafers. However, the present disclosure is not limited to such a configuration, and the article W may be a container that accommodates contents (reticles, glass substrates, etc.) other than semiconductor wafers, or may be an article other than a container.

(10) Note that the configurations disclosed in the embodiments described above are applicable in combination with configurations disclosed in other embodiments (including combinations of the embodiments described as Other Embodiments) as long as no inconsistency arises. With regard to the other configurations as well, the embodiments disclosed herein are illustrative in all respects. Therefore, various modifications and alterations may be made as appropriate without departing from the gist of the present disclosure.

Outline of the Embodiment

The following describes an outline of the article transport facility described above.

An article transport facility includes: a transport device that moves along a movement path to transport an article; and a storage device that is disposed adjacent to the movement path, and that stores the article; wherein, assuming that a side where the storage device is disposed relative to the movement path in a path width direction that is a width direction of the movement path is a first side, the transport device includes a holding section that holds the article, an elevation mechanism for elevating and lowering the holding section, and a movement mechanism for moving the holding section along the path width direction, and is configured to cause the movement mechanism to cause the holding section to protrude to the first side when transferring the article between the holding section and the storage device, the storage device includes a first storage section, and a second storage section disposed below the first storage section, the first storage section includes a first support portion that supports the article, and a movable support portion that movably supports the first support portion in the path width direction, the second storage section includes a second support portion whose position in the path width direction relative to the movement path is fixed, and that supports the article, and, assuming that a space occupied by the article in a state of being supported by the second support portion is a target space, a position at which the first support portion overlaps the target space in an up-down view along an up-down direction is an overlapping position, and a position that is adjacent to the first side relative to the overlapping position, and at which the first support portion does not overlap the target space in the up-down view is a non-overlapping position, the transport device is provided with an operation section that acts on the storage device by coming into contact therewith so as to switch a position of the first support portion between the overlapping position and the non-overlapping position.

In this configuration, the storage device disposed on the first side relative to the movement path includes the first storage section, and the second storage section disposed below the first storage section. Also, the holding section that has been moved by the movement mechanism so as to protrude to the first side is elevated and lowered by the elevation mechanism, whereby the article can be transferred between the holding section and the first storage section or the second storage section. Here, the position, in the path width direction relative to the movement path, of the second support portion provided in the second storage section is fixed, whereas the first support portion provided in the first storage section is supported by the movable support portion so as to be movable in the path width direction. Also, the transport device is provided with the operation section that switches the position of the first support portion between the overlapping position and the non-overlapping position. Thus, when the article is transferred between the holding section and the second storage section, the first support portion or the article supported by the first support portion can be retracted from the elevation path of the holding section or the article held by the holding section by moving the first support portion to the non-overlapping position. Accordingly, with this configuration, it is possible to achieve a configuration that enables the transport device to transfer the article between the transport device and both of the first storage section and the second storage section, without providing the transport device with a mechanism for elevating and lowering the movement mechanism beyond the length of the article in the up-down direction.

Although the transport device needs to be provided with the operation section that switches the position of the first support portion between the overlapping position and the non-overlapping position in this configuration, a higher degree of freedom in the configuration and the arrangement can be easily ensured for such an operation section, than for a mechanism for elevating and lowering the movement mechanism by a height equivalent to at least the height of the article. Accordingly, with this configuration, it is possible to achieve a configuration that enables the transport device to transfer the article to and from a storage section at each level, while suppressing an increase in the complexity of the configuration of the transport device.

This configuration further has the following advantages. While it may be possible to adopt a configuration in which, unlike this configuration, the first support portion is fixed at the non-overlapping position, in that case, the amount of protrusion of the holding section to the first side that is required to transfer the article between the holding section and the first storage section is likely to increase. In contrast, with this configuration, the first support portion can be moved to the overlapping position when the article is transferred between the holding section and the first storage section. Accordingly, the amount of protrusion of the holding section to the first side that is required to transfer the article between the holding section and the first storage section can be the same as or comparable to the amount of protrusion of the holding section to the first side that is required to transfer the article between the holding section and the second storage section. In this respect as well, this configuration can suppress an increase in the complexity of the configuration of the transport device. Furthermore, when the article is transferred between the holding section and the second storage section, this configuration allows the first support portion to be retracted to a position at which the first support portion is less likely to interfere with such transfer. Accordingly, the gap between the article supported by the second support portion and the first support portion in the up-down direction can be kept small, thus also making it possible to suppress an increase in the size of the storage device in the up-down direction.

Here, it is preferable that the article transport facility includes a control unit that controls the transport device, wherein the control unit controls a state of an operation by the operation section on the first support portion such that the first support portion is disposed at the overlapping position when the article is transferred between the holding section and the first support portion, and that the first support portion is disposed at the non-overlapping position when the article is transferred between the holding section and the second support portion.

With this configuration, the first support portion is disposed at the overlapping position when the article is transferred between the holding section and the first support portion, and, therefore, the amount of protrusion of the holding section to the first side can be the same or comparable to the case where the article is transferred between the holding section and the first storage section, and the case where the article is transferred between the holding section and the second storage section. Thus, it is possible to simplify the configuration of the transport device. Furthermore, since the first support portion is disposed at the non-overlapping position when the article is transferred between the holding section and the second support portion, the first support portion or the article supported by the first support portion can be retracted from the elevation path of the holding section or the article held by the holding section. Accordingly, the article can be transferred to both of the first support portion and the second support portion by performing the same operation in which the holding section that has been moved so as to protrude to the first side is elevated and lowered, and it is thus possible to simplify the configuration and the control of the transport device. In this configuration, such control of the state of the operation performed by the operation section on the first support portion is performed by the control unit that controls the transport device in which the operation section is provided. Therefore, there is no need to perform cooperative control between the transport device and the storage device in order to switch the position of the first support portion in the above-described manner, thus making it possible to simplify the control system of the article transport facility.

It is preferable that the transport device includes an operation mechanism for moving the operation section separately from the holding section along the path width direction, the operation section is configured to press, toward the first side, a pressed portion provided in the storage device as the operation section moves to the first side, and, assuming that one of the overlapping position and the non-overlapping position is a first position, and the other is a second position, the first storage section is configured such that the first support portion moves from the first position to the second position as the pressed portion is pressed toward the first side, and that the first support portion moves from the second position to the first position as the pressing on the pressed portion toward the first side is released.

With this configuration, the switching of the position of the first support portion between the overlapping position and the non-overlapping position can be performed by pressing or not pressing the pressed portion toward the first side using the operation section, and it is therefore possible to simplify the configuration and the control of the operation section. Also, this configuration allows the first support portion to be disposed at an appropriate position by pressing the pressed portion toward the first side using the operation section when the article is transferred between the holding section and the second support portion if the overlapping position is the first position and the non-overlapping position is the second position, and pressing the pressed portion toward the first side using the operation section when the article is transferred between the holding section and the first support portion if the non-overlapping position is the first position and the overlapping position is the second position. Accordingly, the article can be appropriately transferred to both of the first support portion and the second support portion.

In the above-described configuration in which the first support portion moves from the first position to the second position as the pressed portion is pressed toward the first side, it is preferable that the pressed portion is provided so as to move integrally with the first support portion in the path width direction, and the first position is the overlapping position, and the second position is the non-overlapping position.

With this configuration, the pressed portion is provided so as to move integrally with the first support portion along the path width direction, and it is therefore possible to simplify the configuration of coupling between the pressed portion and the first support portion, thus simplifying the configuration of the storage device. Furthermore, in this configuration, it is assumed that the first position, which is the position of the first support portion in a normal state in which the pressing on the pressed portion toward the first side is released, is the overlapping position. Accordingly, when the article is transferred between the holding section and the first support portion, the article can be transferred without switching the position of the first support portion, and the speed of transferring the article between the holding section and the first support portion can be easily increased.

It is preferable that the operation section is configured to move to the same side as a side to which the holding section moves in the path width direction, as the holding section moves in the path width direction, and, assuming that one of the overlapping position and the non-overlapping position is a first position, and the other is a second position, the article transport facility includes a switching mechanism for switching a state of an operation by the operation section on the first support portion between an enabled state in which the first support portion moves from the first position to the second position as the operation section moves to the first side, and a disabled state in which the first support portion is kept at the overlapping position or the non-overlapping position, regardless of whether or not the operation section moves to the first side.

With this configuration, the state of the operation by the operation section on the first support portion can be switched between the enabled state and the disabled state by the switching mechanism. Accordingly, even when, as in the case of this configuration, the operation section is configured to move to the same side as the side to which the holding section moves in the path width direction as the holding section moves in the path width direction, the position of the first support portion can be maintained or switched when the holding section is caused to protrude to the first side. Thus, it is possible to dispose the first support portion at the overlapping position when the article is transferred between the holding section and the first support portion, and to dispose the first support portion at the non-overlapping position when the article is transferred between the holding section and the second support portion, so that the article can be appropriately transferred to both of the first support portion and the second support portion.

In the above-described configuration including the switching mechanism that switches the state of the operation by the operation section on the first support portion between the enabled state and the disabled state, it is preferable that the article transport facility includes a control unit that controls the transport device, wherein the control unit is configured to switch the state of the operation performed by the operation section on the first support portion between the enabled state and the disabled state by switching an orientation of the operation section.

With this configuration, the state of the operation by the operation section on the first support portion can be switched between the enabled state and the disabled state by switching the orientation of the operation section, while fixing the position and the orientation of the members on the storage device side that are operated by the operation section. In this configuration, the switching of the orientation of the operation section is performed by the control unit that controls the transport device in which the operation section is provided. Therefore, there is no need to perform cooperative control between the transport device and the storage device in order to switch the state of the operation by the operation section on the first support portion, thus making it possible to simplify the control system of the article transport facility.

In the above-described configuration in which the control unit switches the state of the operation by the operation section on the first support portion between the enabled state and the disabled state by switching the orientation of the operation section, it is preferable that the first storage section is configured such that the first support portion moves from the first position to the second position as a pressed portion provided in the storage device is pressed toward the first side, and that the first support portion moves from the second position to the first position as the pressing on the pressed portion toward the first side is released, the operation section is configured such that an orientation thereof is switchable between a pressing orientation for pressing the pressed portion toward the first side as the operation section moves to the first side, and a non-pressing orientation that is not the pressing orientation, and the control unit is configured to switch the state of the operation performed by the operation section on the first support portion to the enabled state by switching the orientation of the operation section to the pressing orientation, and to switch the state of the operation performed by the operation section on the first support portion to the disabled state by switching the orientation of the operation section to the non-pressing orientation.

With this configuration, the orientation change of the operation section for switching the state of the operation by the operation section on the first support portion can be a relatively minor orientation change sufficient to switch whether or not to press the pressed portion when the operation section has moved to the first side. Accordingly, it is possible to simplify the configuration of the operation section. Also, this configuration allows the first support portion to be disposed at an appropriate position by switching the orientation of the operation section to the pressing orientation when the article is transferred between the holding section and the second support portion if the overlapping position is the first position and the non-overlapping position is the second position, and switching the orientation of the operation section to the pressing orientation when the article is transferred between the holding section and the first support portion if the non-overlapping position is the first position and the overlapping position is the second position. Accordingly, the article can be appropriately transferred to both of the first support portion and the second support portion.

In each of the article transport facilities having the above-described configurations, it is preferable that, assuming that one of the overlapping position and the non-overlapping position is a first position, and the other is a second position, the first support portion is disposed at the first position in a state in which the first support portion is not operated by the operation section, and the storage device is configured to generate at least part of a force for moving the first support portion from the second position to the first position, using one or both of a weight of the first support portion and a biasing force exerted by a biasing mechanism.

With this configuration, the first support portion can be constantly disposed at the first position in the state of not being operated by the operation section. Accordingly, unlike a configuration in which the first support portion in the state of not being operated by the operation section is switched on a case-by-case basis, the situation where the switching of the position of the first support portion is required can be limited to one of the cases where the article is transferred between the holding section and the first support portion, and where the article is transferred between the holding section and the second support portion. Thus, for example, when the state of the operation by the operation section on the first support portion is switched through control, it is possible to simplify that control. Furthermore, this configuration allows the first support portion that has been moved to the second position to be returned to the first position using one or both of the weight of the first support portion and the biasing force exerted by the biasing mechanism, thus making it possible to simplify the configuration for returning the first support portion to the first position.

It is preferable that the transport device moves along a movement path formed along a ceiling, and the storage device is supported by the ceiling.

With this configuration, when the transport device is a ceiling transport device that moves along a movement path formed along a ceiling, a plurality of levels of storage devices each including the first storage section and the second storage section can be disposed by effectively using the space on the ceiling side.

It is sufficient that the article transport facility according to the present disclosure can achieve at least one of the above-described effects.

What is claimed is:

1. An article transport facility comprising:
a transport device that moves along a movement path to transport an article; and
a storage device disposed adjacent to the movement path and stores the article;
wherein:
a side where the storage device is disposed relative to the movement path in a path width direction that is a width direction of the movement path is a first side,
the transport device comprises:
a holding section that holds the article;
an elevation mechanism for elevating and lowering the holding section; and
a movement mechanism for moving the holding section along the path width direction, and configured to cause the movement mechanism to cause the holding section to protrude to the first side when transferring the article between the holding section and the storage device,
the storage device comprises a first storage section and a second storage section disposed below the first storage section,
the first storage section comprises:
a first support portion that supports the article; and
a movable support portion that movably supports the first support portion in the path width direction,
the second storage section comprises a second support portion whose position in the path width direction relative to the movement path is fixed and that supports the article,
a space occupied by the article in a state of being supported by the second support portion is a target space, a position at which the first support portion overlaps the target space in an up-down view along an up-down direction is an overlapping position, and a position that is adjacent to the first side relative to the overlapping position and at which the first support portion does not overlap the target space in the up-down view is a non-overlapping position, and
the transport device comprises an operation section that acts on the storage device by coming into contact therewith so as to switch a position of the first support portion between the overlapping position and the non-overlapping position.

2. The article transport facility according to claim 1, further comprising:
a control unit that controls the transport device, and
wherein the control unit controls a state of an operation by the operation section on the first support portion such that the first support portion is disposed at the overlapping position when the article is transferred between the holding section and the first support portion, and
wherein the first support portion is disposed at the non-overlapping position when the article is transferred between the holding section and the second support portion.

3. The article transport facility according to claim 1,
wherein the transport device comprises an operation mechanism for moving the operation section separately from the holding section along the path width direction,
wherein the operation section is configured to press, toward the first side, a pressed portion provided in the storage device as the operation section moves to the first side,
wherein one of the overlapping position and the non-overlapping position is a first position and the other is a second position, and
wherein the first storage section is configured such that the first support portion moves from the first position to the second position as the pressed portion is pressed toward the first side, and the first support portion moves from the second position to the first position as the pressing on the pressed portion toward the first side is released.

4. The article transport facility according to claim 3,
wherein the pressed portion is configured to move integrally with the first support portion in the path width direction, and
wherein the first position is the overlapping position and the second position is the non-overlapping position.

5. The article transport facility according to claim 1,
wherein the operation section is configured to move to the same side as a side to which the holding section moves in the path width direction as the holding section moves in the path width direction,
wherein one of the overlapping position and the non-overlapping position is a first position and the other is a second position,
wherein the article transport facility comprises a switching mechanism for switching a state of an operation by the operation section on the first support portion between an enabled state in which the first support portion moves from the first position to the second position as the operation section moves to the first side, and a disabled state in which the first support portion is kept at the overlapping position or the non-overlapping position, regardless of whether or not the operation section moves to the first side.

6. The article transport facility according to claim 5, further comprising:
a control unit that controls the transport device, and
wherein the control unit is configured to switch the state of the operation performed by the operation section on the first support portion between the enabled state and the disabled state by switching an orientation of the operation section.

7. The article transport facility according to claim 6,
wherein the first storage section is configured such that the first support portion moves from the first position to the second position as a pressed portion provided in the storage device is pressed toward the first side, and the first support portion moves from the second position to the first position as the pressing on the pressed portion toward the first side is released,
wherein the operation section is configured such that an orientation thereof is switchable between a pressing orientation for pressing the pressed portion toward the first side as the operation section moves to the first side, and a non-pressing orientation that is not the pressing orientation, and
wherein the control unit is configured to switch the state of the operation performed by the operation section on the first support portion to the enabled state by switching the orientation of the operation section to the pressing orientation, and to switch the state of the operation performed by the operation section on the first support portion to the disabled state by switching the orientation of the operation section to the non-pressing orientation.

8. The article transport facility according to claim 1,
wherein one of the overlapping position and the non-overlapping position is a first position and the other is a second position,
wherein the first support portion is disposed at the first position in a state in which the first support portion is not operated by the operation section, and
wherein the storage device is configured to generate at least part of a force for moving the first support portion from the second position to the first position, using one or both of a weight of the first support portion and a biasing force exerted by a biasing mechanism.

9. The article transport facility according to claim 1,
wherein the transport device moves along a movement path formed along a ceiling, and
wherein the storage device is supported by the ceiling.

* * * * *